United States Patent [19]

Tsang et al.

[11] 4,247,917
[45] Jan. 27, 1981

[54] MOS RANDOM-ACCESS MEMORY

[75] Inventors: Siu K. Tsang, San Jose, Calif.; Carl J. Simonsen; William M. Holt, both of Aloha, Oreg.

[73] Assignee: Intel Corporation, Santa Clara, Calif.

[21] Appl. No.: 70,132

[22] Filed: Aug. 27, 1979

[51] Int. Cl.³ .......................... G11C 7/00; G11C 7/06
[52] U.S. Cl. ...................................... 365/205; 365/210
[58] Field of Search ............... 365/149, 205, 210, 207

[56] References Cited
U.S. PATENT DOCUMENTS

| 4,038,646 | 7/1977 | Mehta et al. | 365/205 |
| 4,081,701 | 3/1978 | White et al. | 365/205 |
| 4,130,897 | 12/1978 | Horne et al. | 365/205 |
| 4,158,241 | 6/1979 | Takemae et al. | 365/205 |
| 4,198,697 | 4/1980 | Kuo et al. | 365/210 |

Primary Examiner—Stuart N. Hecker
Attorney, Agent, or Firm—Blakely, Sokoloff, Taylor & Zafman

[57] ABSTRACT

An MOS dynamic random-access memory (RAM) realizable as a 64K RAM is disclosed. Single transistor cells employing capacitive storage are coupled to folded bit-line halves. These bit-line halves are connected to sense amplifiers employing cross-coupled transistors. Boosting means employing a variable capacitance are coupled to the bit-line halves to boost the potential on a line during reading. The capacitor associated with each of the memory cells is coupled to a potential which is greater than the power supply potential. This plate potential is substantially constant and independent of power supply variations and is internally generated. The dummy cells employed within the RAM are charged in a unique manner to a substantially constant potential which does not vary with power supply variations.

14 Claims, 7 Drawing Figures

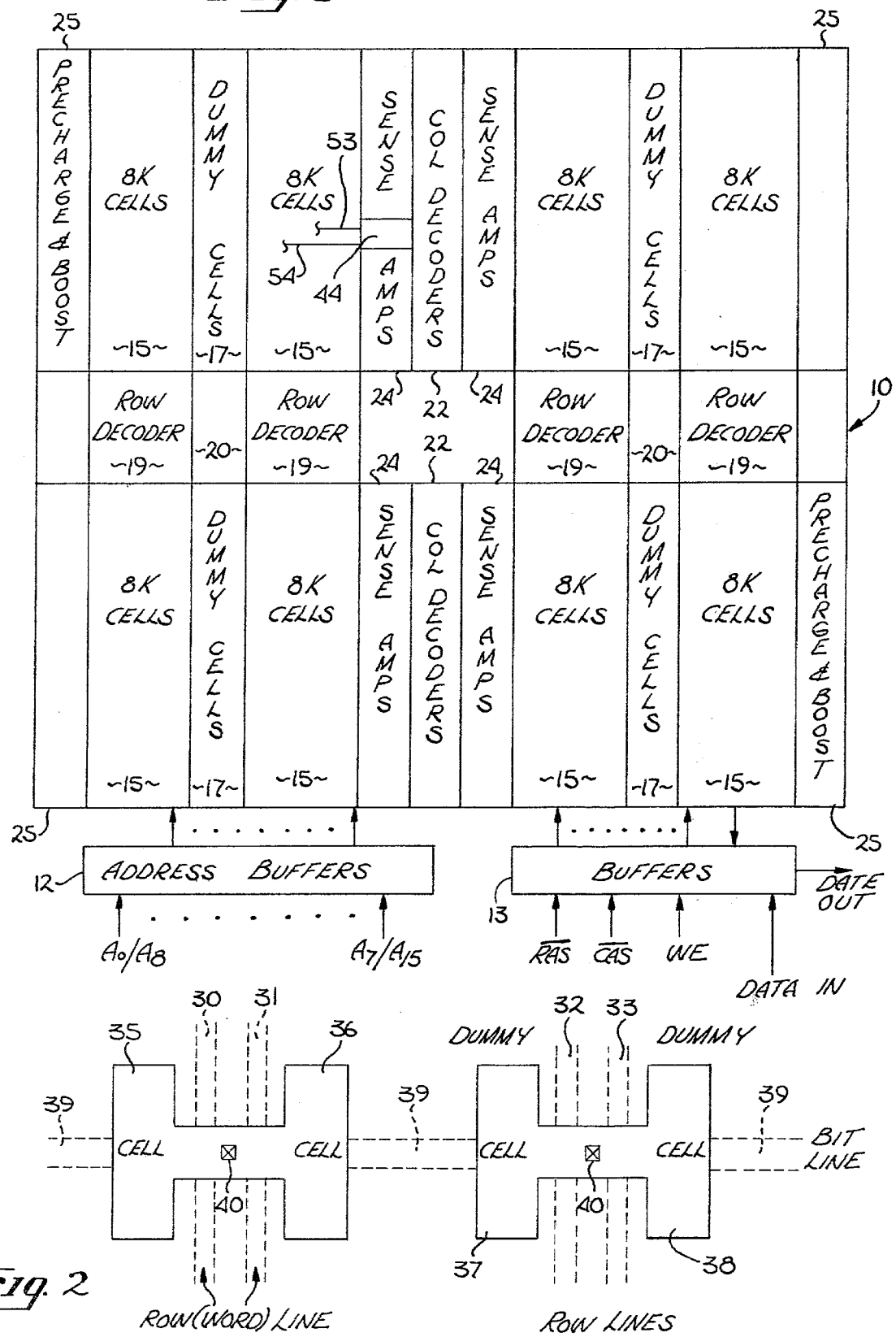

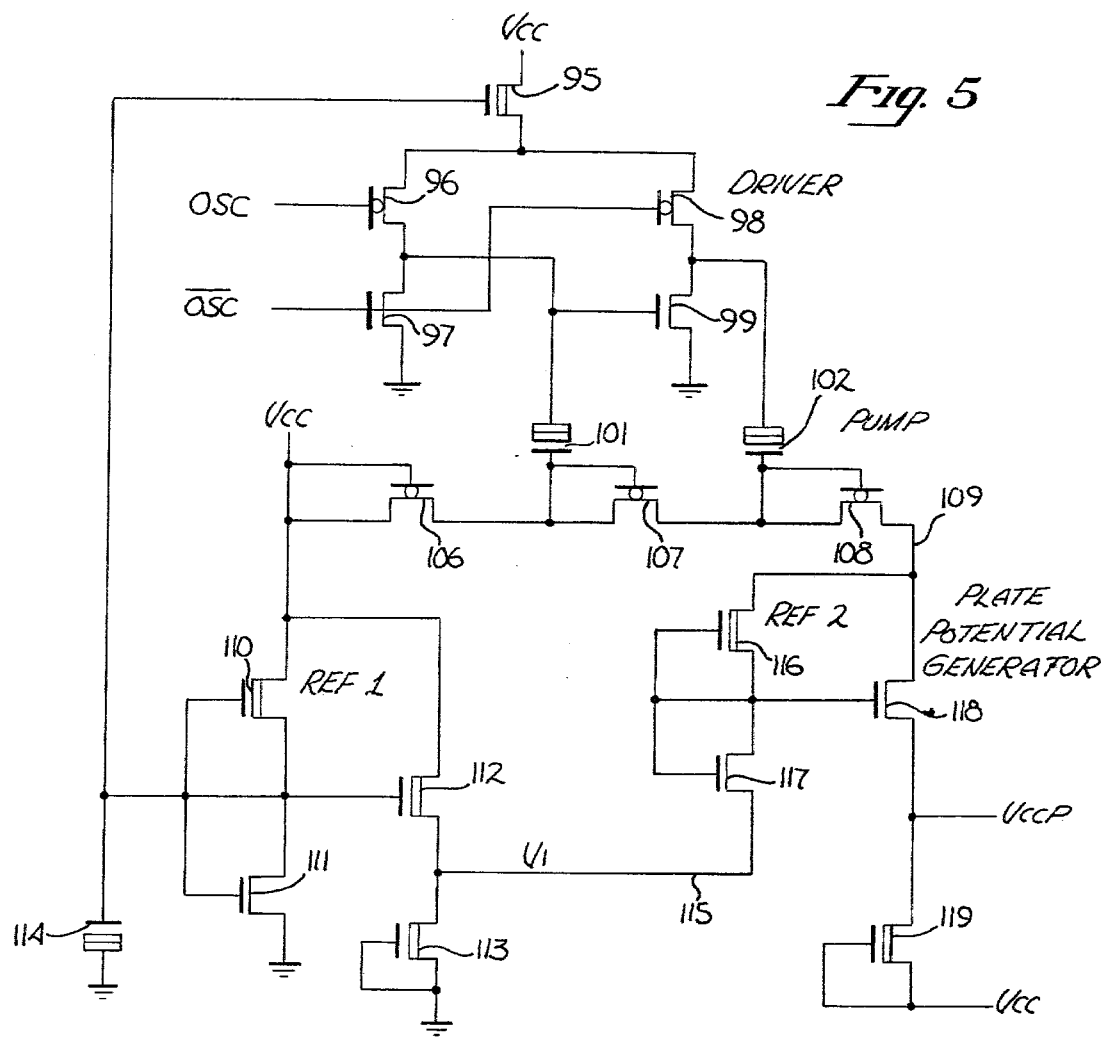
Fig. 5
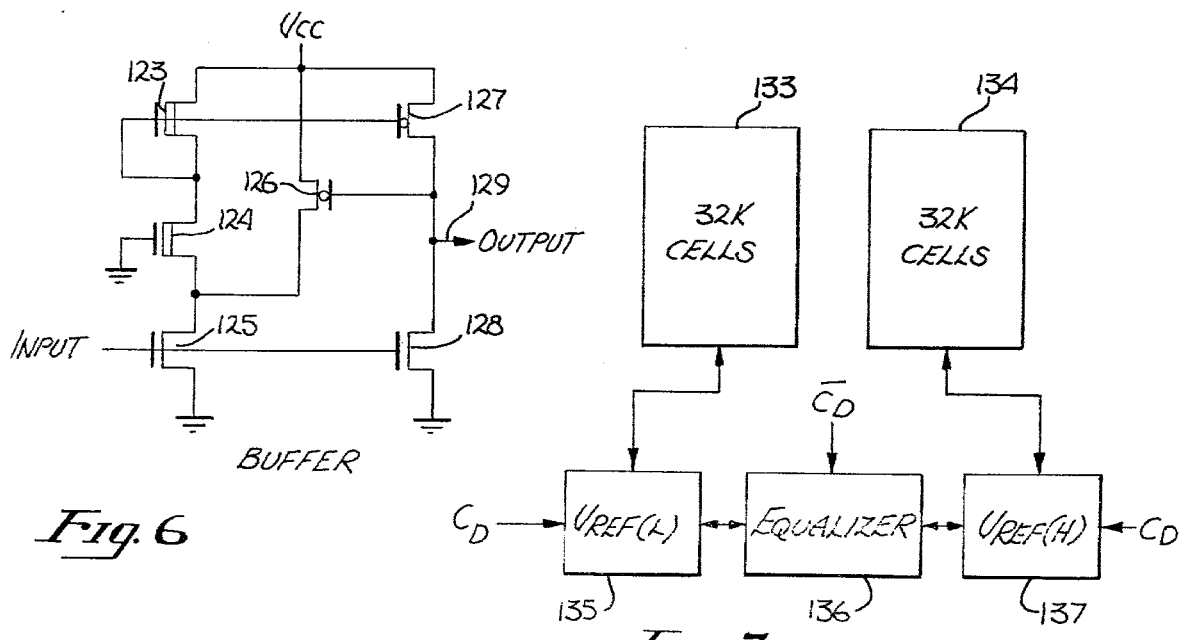
Fig. 6
Fig. 7

MOS RANDOM-ACCESS MEMORY

BACKGROUND OF THE INVENTION

1. Field of the Invention

The invention relates to the field of MOS dynamic memories.

2. Prior Art

Metal-oxide-semiconductor (MOS) dynamic memories are well-known and widely used. A substantial number of these memories employ memory cells which have a single MOS transistor and a capacitance means. These cells are disclosed in U.S. Pat. No. 3,387,286. Often these memory cells are connected to split bit-lines (bit-line halves), with each bit-line half being coupled to one input of a bistable sense amplifier having cross-coupled field-effect transistors. This configuration is shown in U.S. Pat. No. 3,514,765. An improvement to this configuration employing dummy cells to balance the input to the sense amplifier is disclosed in U.S. Pat. No. 3,678,473.

In recent years, these dynamic memories have steadily increased in capacity and density; 16K memories are now widely used. Currently there is an effort in the semiconductor industry to provide practical 64K (65,536 bits) memories. However, to do this it is necessary to optimize many of the circuits and circuit techniques employed in the prior art memories.

The present application discloses a 64K RAM having the general structure described in the above-referenced patents. A number of significant improvements are described which permit the practical realization of a 64K RAM. In the following description, a number of prior art patents are cited at appropriate places in the application. These patents and those cited above are the closest prior art known to the applicant.

SUMMARY OF THE INVENTION

An MOS random-access memory which includes a plurality of memory cells, each having an MOS transistor and a capacitance means for storing charge, is described. The memory includes sense amplifiers, each having a pair of cross-coupled MOS transistors. The memory cells are coupled along pairs of bit-line halves; these bit-line halves are coupled to the cross-coupled field-effect transistors of the sense amplifiers. In this manner, as is customary, upon the selection of one of the MOS transistors by decoders, the charge stored on one of the capacitance means is sensed by each sense amplifier. The memory also includes boosting means for boosting the potential on one of the bit-line halves during the sensing of the charge on the capacitance means. This boosting means includes pairs of variable capacitors, one coupled to each bit-line half. These variable capacitors provide a larger capacitance when a bit-line half is at a higher potential and a lower capacitance when the bit-line half is at a lower potential. In this manner, the bit-line half with the higher potential is boosted to even a higher potential by the boosting means.

BRIEF DESCRIPTION OF THE DRAWINGS

FIG. 1 is a block diagram illustrating the general layout of the memory array of the present invention.

FIG. 2 is a plan view illustrating the general layout of the memory cells and dummy cells along the bit-lines and row-lines for the memory of FIG. 1.

FIG. 5 is an electrical schematic of a plate potential generator used to generate a plate potential which is applied top the capacitors of the memory cells.

FIG. 6 is an electrical schematic of a buffer employed in the memory of FIG. 1.

FIG. 7 is a block diagam illustrating the reference potential generators for the dummy cells used in the memory.

DETAILED DESCRIPTION OF THE INVENTION

Figure 3:
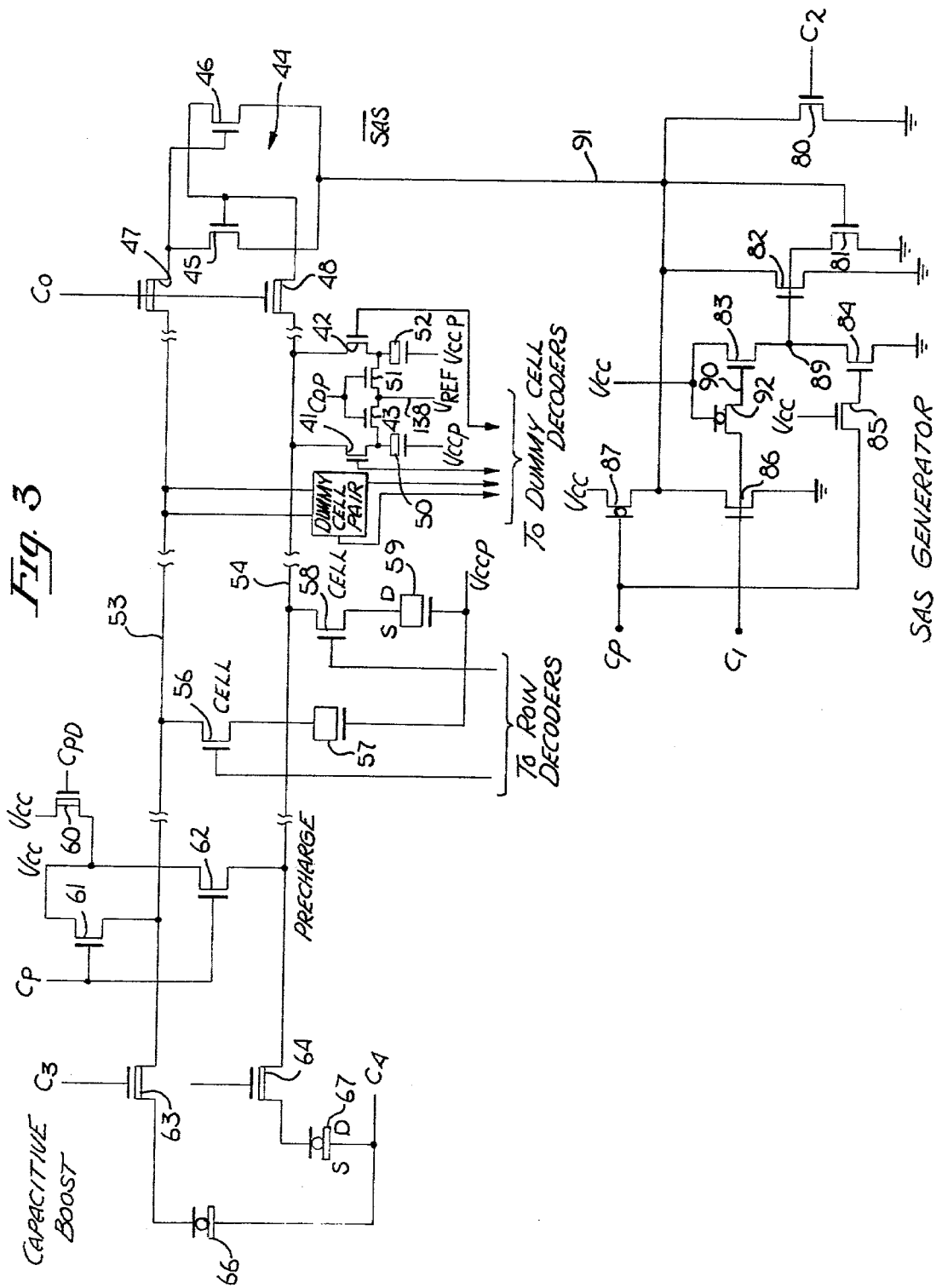
FIG. 3 is an electrical schematic illustrating the presently preferred embodiment of the sense amplifier, folded bit-lines and memory cells and other circuits employed in the memory of FIG. 1.

A metal-oxide-semiconductor (MOS) integrated circuit, random-access memory (RAM) is described. The memory is of the general type which employs single transistor cells with dynamic storage. In the following description, numerous specific details, such as specific number of bits, specific potentials, etc., are set forth to provide a thorough understanding of the present invention. However, it will be obvious to one skilled in the art that the art that the invention may be practiced without these specific details. In other instances, well-known circuits, structure, etc. are set forth in block diagram form in order not to obscure the present invention in unnecessary detail.

In its presently preferred embodiment, the described memory is a 64K (65,536 bits) memory with an externally viewed organization of $64K \times 1$. The memory receives 16 address signals which are time-multiplexed on 8 address leads. The entire memory is fabricated on a single, p-type silicon substrate of approximately 48,000 mils$^2$. Each cell has an area of approximately 0.30 mils$^2$. A single power supply of +5 volts ($V_{CC}$) is used to power the memory.

The specific MOS technology employed in the fabrication of the memory is generally described in U.S. Pat. No. 4,052,229. The process described in this patent results in a number of different transistor types, each having a different threshold voltage. A high resistivity, p-type silicon substrate (50 ohm-cm) is used which results in high mobility devices with low body effect. One transistor type employed in the memory is an enhancement mode transistor having a threshold voltage of approximately 0.7 volts. The standard field-effect transistor symbol is employed in the drawings to designate this type transistor, such as transistor 46 of FIG. 3. The second transistor type employed in the memory is a depletion mode transistor having a threshold voltage of approximately $-2.55$ volts. The symbol designation used for this transistor type is shown by transistor 48 of FIG. 3. The third transistor type employed in the present memory has a threshold voltage approximately equal to zero volts. In typical fabrication, the threshold voltage of these devices ranges between $-0.3$ to $+0.2$ volts. This device is referred to in this application as a "zero" threshold transistor or device since its threshold is approximately zero volts. The symbol designation for this device includes a small "o" under the gate, as shown by transistor 98 of FIG. 5.

Referring now to FIG. 1, the internal organization of the memory includes four 16K groups of cells with each 16K group bisected by a row of dummy cells. Specifically, each 8K group 15 is bisected by dummy cells 17.

Each of the 16K groups of cells share common row decoders 19 with another 16K group of cells. The row decoders 19 select word lines in the array. Also, each 16K group of cells shares column decoders 22 with another 16K group of cells. The decoders 22 select bit-lines in the array. As mentioned, the memory receives a 16 bit address, time-multiplexed into two address groups (row addresses and column addresses). These addresses are shown coupled to address buffers 12. The control signals such as the row address signal ($\overline{RAS}$), column address signal ($\overline{CAS}$), write-enable signal (WE) are shown coupled to buffers 13. The presently preferred embodiment for these buffers is described in detail in conjunction with FIG. 6. The decoders are standard decoders, well-known in the art.

The memory is refreshed employing a 128-cycle refreshing scheme. This refreshing scheme, in addition to the general logic employed with the control signals $\overline{RAS}$, $\overline{CAS}$ and WE are described in U.S. Pat. No. 4,079,462.

The sense amplifiers 24 are disposed along both sides of the column decoders 22. One such sense amplifier 44 is shown in block diagram form in FIG. 1 and in detail in FIG. 3. The bit-line halves often employed with these cross-coupled sense amplifiers generally extend from opposite sides of the sense amplifier into the array. However, in the presently preferred embodiment, the bit-line halves are folded and extend, adjacent to one another, into the array such as shown by the partial lines 53 and 54 connected to the sense amplifier 44. These lines are also shown in FIG. 3 and will be described in more detail in conjunction with that FIGURE.

Each of the memory cells employed in the memory comprises a field-effect transistor such as transistor 58 (FIG. 3) and a capacitance means for storing charge such as capacitance means 59. The capacitance means is selectively coupled to a bit-line half such as line 54 when the row decoders select the transistor 58. Each of the capacitance means comprises a general field-effect transistor structure having a source and drain region coupled to the source region of the transistor (such as transistor 58) and an overlying gate (plate) insulated from the substrate and connected to a source of plate potential ($V_{CCP}$). Another cell comprising transistor 56 and capacitance means 57 is connected to the other bit-line half 53. As will be appreciated, only a single memory cell is shown connected to each of the bit-line halves whereas in the actual memory, 64 cells are connected to each bit-line half. "Dummy" cells for providing a reference potential during the sensing of charge stored in a selected memory cell are widely used in dynamic RAMs. (See, for example, U.S. Pat. No. 3,678,473). In the presently preferred embodiment, each bit-line half includes a pair of dummy cells. Each of these dummy cells has a field-effect transistor and a capacitance means. For example, transistor 41 is coupled to capacitance means 50, thus allowing this capacitance means to be selectively coupled to the bit-line half 54. Similarly, transistor 42 is connected in series with capacitance means 52 allowing this capacitance means to be connected to the bit-line half 54. The gates of the transistors 41 and 42 are coupled to the dummy cell decoders 20 shown in FIG. 1. The capacitance means 50 and 52 of these dummy cells are selectively coupled to line 138 by transistors 43 and 44, respectively. As is well-known in the art, when a memory cell on one bit-line half, such as line 53, is selected, a dummy cell is coupled to the other bit-line half, such as line 54. In the presently preferred embodiment, each of the capacitance means associated with each of the dummy cells includes a pair of regions in the substrate and an overlying gate (plate) such as is the case with the memory cells. These plates are also connected to the $V_{CCP}$ potential. Unlike the memory cells, however, the pair of substrate regions are connected to receive a reference potential identified as $V_{REF}$ through transistors 43 and 49 at the end of the memory cycle by the $C_{DP}$ signal.

Referring now to FIG. 2, in the presently preferred layout of the memory cells and dummy cells, these cells are arranged in symmetrical pairs, with each member of the pair extending to the right and left of adjacent word lines. For example, the memory cell 36 is disposed to the right of the word line 31 and is coupled to this word line through the metal contact 40. The other member of this pair, cell 35, is disposed to the left of the word line 30 and is coupled to this word line through the metal contact 40. Similarly, the dummy cells 37 and 38 are coupled to row lines 32 and 33, respectively, again through metal contact 40. The cells 35, 36 and the dummy cells 37 and 38 are all along a common bit-line 39 which corresponds to a bit-line half such as lines 53 or 54 of FIG. 3.

The dummy cell decoders 20 select a "right" or "left" dummy cell. If a "right" memory cell is selected, such as cell 36, a "right" dummy cell is selected, such as cell 38. Similarly, if a "left" memory cell is selected, such as cell 35, a "left" dummy cell is selected, such as cell 37. This selection of dummy cells is made to compensate for masking misalignments which are inherent in paired cells. More specifically, all the "right" memory cells to some extent have the same misalignment as the "right" dummy cells. Thus by selecting one of these dummy cells, a better match occurs. Likewise, all the "left" memory cells and dummy cells have the same masking misalignments and by selecting both "left" memory cells and dummy cells, compensation for misalignments is provided. The pairing of the memory cells provides a more efficient layout. The pairing of the dummy cells makes feasible the use of the paired memory cells.

Referring again to FIG. 3, the sense amplifier 44 comprises the cross-coupled, field-effect transistors 45 and 46. The gate of transistor 46 and drain terminal of transistor 45 are coupled to the bit-line half 53 throuh the transistor 47. The gate of the transistor 45 and the drain terminal of transistor 46 are coupled to the other bit-line half 54 through the transistor 48. The depletion mode transistors 47 and 48 receive a timing signal $C_O$ (FIG. 4) which isolates the bit-line halves from the sense amplifier during part of a sensing cycle (reading). The source terminals of the transistors 45 and 46, as well as the other sense amplifiers, receive a sense amplifier strobe signal (SAS) on line 91.

Pre-charging means and boosting means are disposed at the end of each of the bit-line halves as shown by the blocks 25 of FIG. 1. The pre-charging means for each pair of bit-line halves comprises a pair of enhancement mode transistors 61 and 62 which are coupled between $V_{CC}$ and the bit-lines through transistor 60. Prior to sensing, as is well-known in the prior art, the bit-line halves are pre-charged. A timing signal ($C_P$) is employed for this purpose for transistors 61 and 62. This signal is delayed ($C_{PD}$) and used to turn-on transistor 60.

It is well-known in the prior art to boost the potential on the bit-line half reaching the higher potential during sensing. For example, if a binary-one is sensed on one bit-line half, this bit-line half is boosted to a full binary-one during the sensing operation. On the other hand, if a binary-zero is sensed on a bit-line half, the other bit-line half is boosted to a full binary-one. Numerous circuits are known for providing this boosting such as the voltage division scheme described in U.S. Pat. No. 3,678,473.

In the presently preferred embodiment, the boosting means for each bit-line half comprises a transistor and a capacitance means. For example, the depletion mode transistor 64 couples the bit-line half 54 to a capacitance means 67. The capacitance means 67 comprises a general field-effect transistor structure with its "source" and "drain" regions coupled to the source of the clocking signal $C_4$ and its gate or plate coupled through transistor 64 to the bit-line half. Similarly, the boosting means for line 53 comprises the depletion mode transistor 63 and the capacitance means 66. As indicated by the small zero under the plates of the capacitance means 66 and 67, these capacitance means, if used as transistors, would have a threshold voltage of approximately zero volts. (The channel regions of these devices use the substrate (50 ohm-cm) without further doping.)

Prior to the time that sensing begins, lines 53 and 54 are pre-charged through transistors 61 and 62. At this time, the $C_3$ signal is high, thus the transistors 63 and 64 heavily conduct, and the $C_4$ signal is at ground potential. The positive potential on the plates of these capacitance means causes a relatively deep depletion region which enhances the capacitance of these structures. Thus, the capacitances 66 and 67 are charged to the potential on the bit-line halves 53 and 54.

Figure 4:
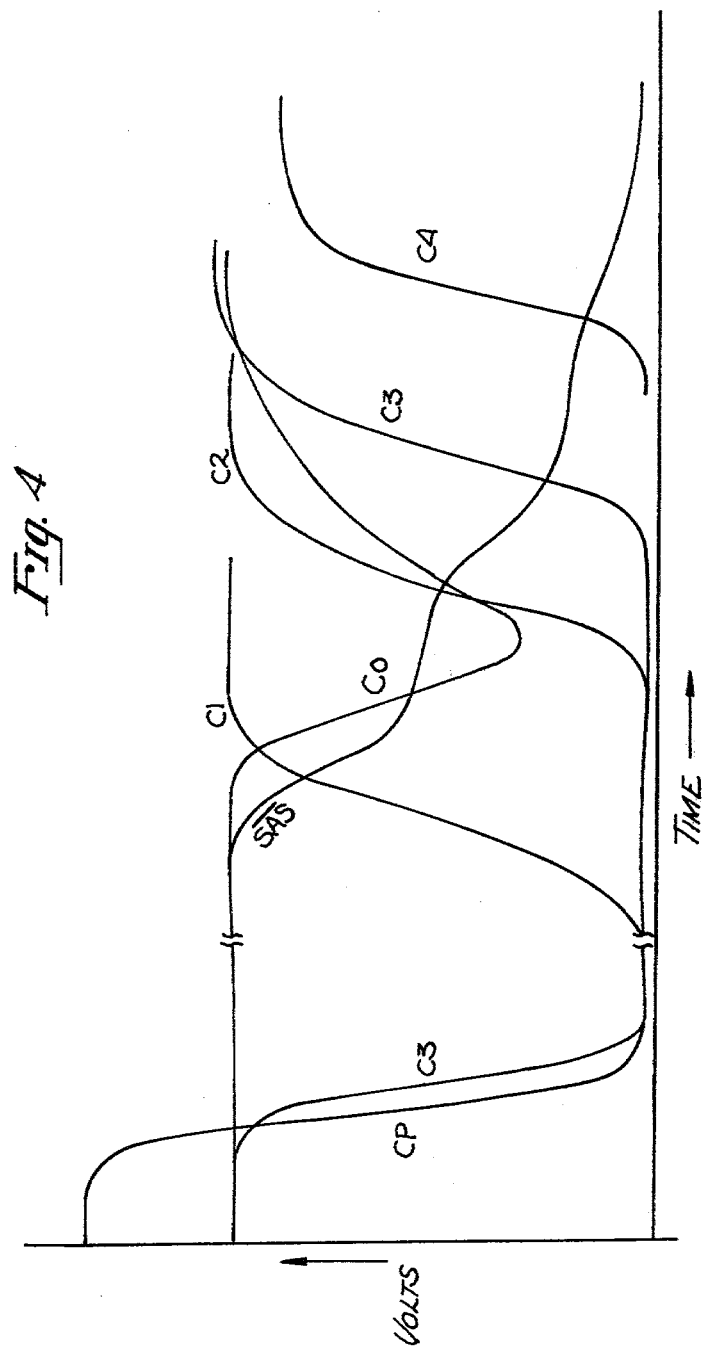
FIG. 4 is a graph illustrating various waveforms associated with the operation of the memory of FIG. 1.

As sensing occurs within the sense amplifier 44, the capacitance means 66 and 67 are decoupled from the bit-line halves in order not to interfere with this sensing. (These capacitance means have relatively large capacitance when compared with the capacitance of a cell.) The waveform for the signal $C_3$ is shown in FIG. 4; the dip in this waveform during the period of time when the $\overline{SAS}$ signal is dropping, effectively decouples the bit-line halves from the capacitance means 66 and 67. After the sensing is substantially completed, the $C_3$ signal rises in potential, again coupling the capacitance means 66 and 67 to the bit-line halves. One of these bit-line halves will be at a higher potential than the other when sensing occurs in a well-known manner.

Assuming that line 53 is at a higher potential, the depletion region associated with capacitance means 66 is substantially maintained. On the other hand, the depletion region associated with capacitance means 67 is substantially reduced since line 54 is at a lower potential, reducing the capacitance of this capacitance means. When the $C_3$ signal is again in its high state, the $C_4$ signal rises in potential as shown in FIG. 4. This provides a boost to the two capacitance means; however, the capacitance of capacitance means 66 is substantially larger than that of capacitance means 67. Thus, line 53 is boosted in potential (to a full binary-one potential), while the boosting means has little effect on line 54.

The above-described boosting means provides substantially better performance than prior art boosting means and is relatively easy to implement within the memory. Variable capacitances have been employed in other memories, although in different configurations and for different purposes, see U.S. Pat. No. 4,122,550.

In the operation of the sense amplifier 44, the source terminals of transistors 45 and 46 (line 91) are held sufficiently high in potential during the pre-charge period to prevent these transistors from conducting. When sensing begins, these terminals are brought to a lower potential to allow the regeneration which sets the bistable circuit in one of its two stable states. The signal which causes these cross-coupled transistors to conduct is shown as the $\overline{SAS}$ signal in FIG. 4.

It has been known that better performance from the sense amplifier is obtained if the $\overline{SAS}$ signal is not suddenly brought to ground potential, but rather follows a somewhat irregular path, as shown by the $\overline{SAS}$ waveform in FIG. 4. This waveform assists in compensating for resistance imbalances in the bit-line halves, capacitive imbalances and threshold imbalances between transistors 45 and 46. (For prior art discussion of the SAS signal and a generator for generating this signal, see U.S. Pat. No. 4,038,646.)

In FIG. 3, a unique SAS generator is shown coupled to line 91. The generator receives three timing signals, the $C_P$ signal which provides pre-charging and the timing signals, and $C_1$ and $C_2$ shown in FIG. 4. The generator includes the zero threshold transistor 87 and the enhancement mode transistor 86 coupled in series between $V_{CC}$ and ground. The $C_P$ signal is applied to the gate of transistor 87. The common junction between these transistors is coupled to one terminal of transistors 80 and 82 and to the line 91. The gate of transistor 86, which receives the $C_1$ signal, is coupled through the zero threshold transistor 92 to the gate of transistor 83. The drain terminal of transistor 83 and the gate of transistor 92 are coupled to $V_{CC}$. The source terminal of transistor 83 (node 89) is coupled to ground through transistor 84, to the gate of transistor 82 and to ground through transistor 81. The gate of transistor 84 receives the $C_P$ signal through the transistor 85.

In operation, first the $C_P$ signal is high, pre-charging line 91 to its high state. This prevents conduction of the cross-coupled transistors 45 and 46 and the other cross-coupled transistors in the other sense amplifiers which are also coupled to line 91. The $C_P$ signal also discharges node 89 through transistor 84. After the $C_P$ signal drops in potential and during sensing, the $C_1$ signal rises in potential as shown in FIG. 4. When this occurs, it causes transistor 86 to conduct, thereby causing the potential on line 91 ($\overline{SAS}$ signal) to drop in potential, as shown in FIG. 4. However, since transistor 86 is relatively small, this drop is not sudden. The $C_1$ signal also causes transistor 83 to conduct, raising the potential on node 89. (Note transistor 84 is no longer conducting.) This, in turn, causes transistor 82 to conduct, further dropping the potential on line 91. Transistor 82 is relatively large when compared to transistor 86. However, transistor 81 prevents the node 89 from quickly rising and thus prevents transistor 82 from heavily conducting.

The rise of potential on node 89 causes node 90 to rise in potential because of the parasitic coupling between these nodes, cutting off transistor 92. When this occurs, node 90 is bootstrapped from node 89, allowing transistor 83 to heavily conduct. Thus the potential on node 89 rises more quickly and transistor 82 begins conducting more heavily. This causes the $\overline{SAS}$ signal to drop more quickly. As the $\overline{SAS}$ signal drops, transistor 81 begins to turn-off allowing mode 89 to rise as the $\overline{SAS}$ signal drops.

Finally, the $C_2$ signal becomes positive, as shown in FIG. 4, causing transistor 80 to conduct. Transistor 80 is larger than transistor 82 and causes line 91 to drop in potential even more quickly.

The SAS generator of FIG. 3 provides considerably more control over the $\overline{SAS}$ signal than prior art generators. The particular circuit is not process-sensitive and provides considerable compensation to imbalances caused by capacitance and resistance differences in the bit-line halves, in addition to threshold voltage differences between transistors 45 and 46.

As previously mentioned, in the presently preferred embodiment, an array plate potential is employed which is higher than the power supply potential, $V_{CC}$. This array plate potential, identified as $V_{CCP}$, is coupled to all of the capacitance storage means of the memory cells and dummy cells, as shown in FIG. 3. The $V_{CC}$ potential of 5 volts, which is employed to power the memory, is boosted by the circuit of FIG. 5 to a potential of approximately 6.5 volts. The $V_{CCP}$ potential of approximately 6.5 volts is a constant potential that does not vary with either temperature or $V_{CC}$ fluctuations. The $V_{CCP}$ potential provides greater capacitance within each of the capacitance means of the cells when compared to coupling the plates of the $V_{CC}$. Moreover, the $V_{CCP}$ potential provides more consistent capacitance storage since it is constant.

Referring to FIG. 5, the circuit for providing the $V_{CCP}$ potential is included on the chip with the remainder of the memory. The circuit generally includes a driver section comprising transistors 96, 97, 98 and 99, a pumping section comprising transistors 106, 107 and 108, and two voltage reference circuits shown as Ref 1 and Ref 2 in FIG. 2.

Transistors 96, 97, 98 and 99 operate in a push-pull mode to provide signal to the pumping circuits through the capacitors 101 and 102. The gates of transistors 96, 97 and 98 receive an oscillator signal from an on-chip oscillator. This signal of approximately 20 MHz provides a high frequency signal through the capacitors 101 and 102 to enable the pumping action. The depletion mode transistor 95 provides power to this driver section. Transistor 95 limits the swing of the drive signal, providing a first order supply regulation to reduce the drain on $V_{CC}$. The capacitor 114, which is a depletion mode device, provides damping to minimize noise. The zero threshold transistors 106, 107 and 108 act as a charge pumper in a well-known manner to provide a potential higher than $V_{CC}$ on node 109.

The constant potential of $V_{CCP}$ includes the potential $V_1$ (node 115) developed by the first reference potential circuit which is added to the potential developed by the second reference potential circuit. Both reference potential circuits develop a potential of approximately 3.25 volts.

Referring to the first potential circuit comprising transistors 110, 111, 112 and 113, the potential on node 115 consists of the difference between the threshold voltages of transistors 111 and 112. This difference is equal to 0.7 (the threshold voltage of transistor 111) minus the threshold voltage of −2.55 (the threshold voltage of transistor 112). The theory of operation of transistors 110, 111, 112, 113 and a discussion of the fact that a constant potential is provided by this configuration independent of both temperature and $V_{CC}$ variations is contained in U.S. Pat. No. 4,100,437.

The transistors 116, 117, 118 and 119 operate in a similar manner to the first reference potential circuit and also provide a potential of approximately 3.25 volts. This is added to the potential on node 115 to provide the $V_{CCP}$ potential of 6.5 volts.

Referring briefly to FIG. 3, a potential identified as $V_{REF}$ (line 138) is applied to the capacitance means 50 and 52 of the dummy cells during the pre-charging period in order that the dummy cells provide the proper potential to one of the bit-line halves during sensing. This potential is approximately equal to 1.5 volts, in the presently preferred embodiment. In the prior art, it has been difficult to provide a constant reliable potential for the dummy cells. In the presently preferred embodiment where 1.5 volts is required, it is difficult to develop an accurate on-chip reference for this potential. Note that the voltage reference circuits of FIG. 3 each provide too high a potential.

Referring to FIG. 7, the system for developing the 1.5 volt potential required for the dummy cells is shown. In FIG. 7, the memory array is shown as having two blocks of 32K cells, blocks 133 and 134. Referring briefly to FIG. 1, block 133 of FIG. 7 includes all the cells to the left of the column decoders 22 and the block 134 of FIG. 7 includes all the cells to the right of the column decoders 22. The reference potential line to all the dummy cells within block 133 is coupled to line 138. The reference line to the dummy cells within block 134 is coupled to line 139. In operation, during the pre-charging period, all the dummy cells in block 134 are charged to a potential $V_{REF(H)}$ (high) and all the dummy cells in block 133 are charged to the potential of $V_{REF(L)}$ (low). Then, these reference potentials are removed; lines 138 and 139 are then coupled to one another through the equalizer 136 and the potential on the dummy cells is equalized. Since the capacitors associated with the dummy cells in both blocks are equal, the resultant potential on the dummy cells is:

$$V_{REF}=(V_{REF(H)}+V_{REF(L)}/2)$$

In the presently preferred embodiment, the voltage reference generator 137 comprises a voltage reference circuit such as employed in FIG. 5, for example, comprising transistors 110, 111, 112 and 113. Thus, the potential applied to line 139 is approximately 3.25 volts. The voltage reference generator 135, in the presently preferred embodiment, simply couples line 138 to ground potential; thus $V_{REF(L)}=0$. When $C_D$ is high (during the pre-charge period), all the cells in block 134 are charged to a potential of 3.25 volts while all the cells in block 133 are discharged to 0 volts. Before sensing, the $C_D$ signal drops in potential and its complement rises, thus activating the equalizer 136. When this occurs, line 138 is decoupled from ground and line 139 is decoupled from the voltage reference circuit. These lines are then connected by the equalizer 136. (The equalizer is basically a switch). The potential on lines 138 and 139 is then equalized, providing a reference potential to all the dummy cells of ½ 3.25. Thus, the potential of approximately 1.5 volts is developed without a reference source of this potential. It should be noted that the potential 3.25 is independent of both temperature and $V_{CC}$ fluctuations and thus the resultant potential applied on the dummy cells is also constant.

There are numerous well-known MOS buffer circuits for receiving a low level input signal such as TTL level signal and converting it to an MOS level signal. Typically, these input stages consist of inverters. It is common in these input stages to employ means to decouple an input transistor from a load to allow the output signal from the stage to rise more quickly. For a general discussion of these circuits, see U.S. Pat. No. 4,048,518; the buffer shown in FIG. 2 of this patent is a type frequently employed in MOS circuitry.

An improved buffer which provides the decoupling of the input transistor 125 is shown in FIG. 6. The buffer of FIG. 6 has been found to provide substantially better performance than prior art buffers. The input stage of the buffer comprises the depletion mode transistor 123 coupled in series with depletion mode transistor 124 and the input transistor, enhancement mode transistor 125. The gate of the input transistor receives the input signal, such as the TTL signal. The gate of the depletion mode transistor 124 is coupled to ground. The gate of the transistor 123 is coupled to the source terminal of this transistor to provide a load. This node is also coupled to the gate of the zero threshold transistor 127. Transistor 126 is coupled between the source of $V_{CC}$ and the common junction between transistors 124 and 125. The gate of this transistor is coupled to the source of transistor 127. (While the input stage in FIG. 6 is shown coupled to $V_{CC}$, this stage may be coupled to the source of a clocking signal.) The second stage in the buffer comprises the transistor 127 coupled in series with the transistor 128. An output is taken at line 129. It will be apparent that numerous second stage may be employed and, in fact, the second stage to the buffer may be identical with the first stage.

Assume that the input signal to transistor 125 is 0.8 volts. This would be a typical low TTL input. For this condition, the drain of transistor 125 rises to approximately 2.5 volts and cause transistor 124 to be off. Leakage current is provided through the transistor 126 for transistor 125. This leakage current prevents the drain terminal of transistor 125 from floating. Note that if this terminal floated, the input stage would be much more sensitive to noise on the input line. Transistor 124 acts as a capacitive isolation means to allow node 122 to rise more quickly once transistor 124 ceases to conduct.

Speed improvements of approximately 30% over prior art circuits have been obtained with the buffer of FIG. 6. Moreover, this buffer eliminates two transistors when compared to the prior art, and is more easily laid-out as an integrated circuit.

Thus, an MOS dynamic RAM which may be realized as a 64K memory has been described. Numerous circuits have been disclosed which permit the fabrication of this large-scale integrated circuit memory.

We claim:

1. An MOS random-access memory comprising:
   a plurality of memory cells, each including an MOS transistor and a capacitance means for storing charge, said capacitance means coupled in series with said MOS transistor;
   at least one sense amplifier having a pair of cross-coupled MOS transistors;
   at least one pair of bit-line halves, one bit-line half coupled to the gate of one of said cross-coupled MOS transistors and the other bit-line half coupled to the gate of the other of said cross-coupled MOS transistors, each bit-line half being coupled to a plurality of said memory cells such that upon the selection of one of said MOS transistors coupled in series with said capacitance means, a charge stored on said capacitance means is sensed by said sense amplifier; and
   boosting means for boosting the potential on one of said bit-line halves during the sensing of charge on one of said capacitance means, said boosting means comprising a pair of variable capacitors, one coupled to each of said bit-line halves and switching means for coupling said variable capacitors to said bit-line halves, said variable capacitors providing a larger capacitance when said bit-line half is at a higher potential and a lower capacitance when said bit-line half is at a lower potential;
   whereby the potential on the one of said bit-line halves which is at said higher potential is boosted to an even higher potential.

2. The MOS memory defined in claim 1 wherein each of said variable capacitors comprises a pair of doped regions in the substrate and a plate member coupled to one of said bit-line halves through one of said switching means.

3. The MOS memory defined by claim 2 wherein a first clocking signal is applied to said pair of doped regions of each of said capacitors to provide a boosted potential to one of said bit-line halves.

4. The MOS memory defined by claim 3 wherein a second clocking signal is applied to said switching means of said boosting means to decouple said variable capacitors from said bit-line halves during the initial period of sensing by said sense amplifier.

5. The MOS memory defined by claim 4 wherein said switching means comprises a pair of depletion mode transistors having their gates coupled to receive said second clocking signal.

6. An MOS random-access memory which operates from a power supply of a first potential comprising:
   a plurality of memory cells, each including an MOS transistor and a capacitance means for storing charge, said capacitance means coupled in series with said MOS transistor;
   at least one sense amplifier having a pair of cross-coupled MOS transistors;
   at least one pair of bit-line halves, one bit-line half coupled to the gate of one of said cross-coupled MOS transistors and the other bit-line half coupled to the gate of the other of said cross-coupled MOS transistors, each bit-line half being coupled to a plurality of said memory cells such that upon the selection of one of said MOS transistors coupled in series with said capacitance means, a charge stored on said capacitance means is sensed by said sense amplifier;
   each of said capacitance means comprising a pair of regions disposed in said substrate and a gate member coupled to said MOS transistor of said cell; and
   generator means coupled to receive said first potential for providing a constant potential higher than said first potential, which is substantially unaffected by fluctuations of said first potential, said constant higher potential being coupled to said regions of said capacitance means;
   whereby greater, more reliable capacitance for said memory cells is obtained.

7. The MOS memory defined by claim 6 wherein said generator means comprises:
   a charge pumping circuit for pumping charge from said first potential to a higher potential;
   a first reference potential source for providing a first constant reference potential; and
   a second reference potential source coupled to said charge pumping circuit for providing a second constant reference potential, coupled in series with said first constant reference potential source to provide said higher constant potential for said regions of said capacitance means.

8. The MOS memory defined by claim 7 wherein each of said first and second reference potential sources provides a potential which is the sum of threshold voltages of an enhancement mode device and a depletion mode device.

9. An MOS random-access memory comprising:
a plurality of memory cells, each including an MOS transistor and a capacitance means for storing charge, said capacitance means coupled in series with said MOS transistors;
at least one sense amplifier having a pair of cross-coupled MOS transistors;
at least one pair of bit-line halves, one bit-line half coupled to the gate of one of said cross-coupled MOS transistors and the other bit-line half coupled to the gate of the other of said cross-coupled MOS transistors, each bit-line half being coupled to a plurality of said memory cells such that upon the selection of one of said MOS transistors coupled in series with capacitance means, a charge stored on said capacitance means is sensed by said sense amplifier;
at least a pair of second capacitance means and means for selectively coupling one of said second capacitance means to one of said bit-line halves when a memory cell on the other bit-line half has been selected and means for coupling the other of said second capacitance means to the other bit-line half when a memory cell on said one bit-line half has been selected, said second capacitance means for providing a reference for said sense amplifier; and
voltage reference means for providing a reference potential for said second capacitance means, comprising, first reference potential means for providing a first reference potential to one of said second capacitance means, second reference potential means for providing a second potential to the other of said second capacitance means, and equalization means for equalizing the potentials on said pair of second capacitance means after the application of said first reference potential and second reference potential.

10. The memory defined by claim 9 wherein said first potential is ground potential.

11. The memory defined by claim 10 wherein said second potential is approximately 3 volts.

12. The MOS memory defined by claim 11 wherein each of said second capacitance means comprises a pair of regions disposed on the substrate which are selectively coupled to one of said bit-line halves, and a plate member.

13. The MOS memory defined by claim 12 wherein said regions are coupled to receive said reference potentials.

14. An MOS dynamic random-access memory comprising:
a plurality of memory cells, each including an MOS transistor and a capacitance means for storing charge, said capacitance means coupled in series with said MOS transistor, said memory cells being arranged in symmetrical pairs about lines in said memory;
at least one sense amplifier having a pair of cross-coupled MOS transistors;
at least one pair of bit-line halves, one bit-line half coupled to the gate of one of said cross-coupled MOS transistors and the other bit-line half coupled to the gate of the other of said cross-coupled MOS transistors, each bit-line half being coupled to a plurality of said memory cells such that upon the selection of one of said MOS transistors coupled in series with said capacitance means, a charge stored on said capacitance means is sensed by said sense amplifier; and
a plurality of dummy cells for providing a reference potential for said cross-coupled MOS transistors, said cells being arranged in symmetrical pairs about lines in said memory and being coupled to said bit-line halves;
whereby an efficient memory lay-out is achieved.

* * * * *